United States Patent [19]

Gordon

[11] 4,142,185
[45] Feb. 27, 1979

[54] LOGARITHMIC ANALOG-TO-DIGITAL CONVERTER

[75] Inventor: Bernard M. Gordon, Magnolia, Mass.

[73] Assignee: Analogic Corporation, Wakefield, Mass.

[21] Appl. No.: 836,160

[22] Filed: Sep. 23, 1977

[51] Int. Cl.² ............................................. H03K 13/02
[52] U.S. Cl. ............................................. 340/347 AD
[58] Field of Search ................... 340/347 AD, 347 M; 325/38 R

[56] References Cited
U.S. PATENT DOCUMENTS

| | | | |
|---|---|---|---|
| 3,049,701 | 8/1962 | Amdahl | 340/347 AD |
| 3,065,422 | 11/1962 | Villars | 340/347 M |
| 3,170,153 | 2/1965 | Brooks | 340/347 AD |
| 3,239,833 | 3/1966 | Gray | 340/347 AD |
| 3,264,637 | 8/1966 | Parkinson | 340/347 AD |
| 3,366,949 | 1/1968 | Bruce | 340/347 M |
| 3,382,438 | 5/1968 | Geller | 325/38 R |
| 3,513,467 | 5/1970 | Sliwkowski | 340/347 M |
| 3,588,881 | 6/1971 | Gordon | 340/347 AD |
| 3,662,347 | 5/1972 | Fox | 340/347 AD |
| 4,048,562 | 9/1977 | Haselwood | 340/347 AD |

Primary Examiner—Charles D. Miller
Attorney, Agent, or Firm—Weingarten, Maxham & Schurgin

[57] ABSTRACT

Method and apparatus for performing a logarithmic analog-to-digital conversion in which the logarithm of an input signal is determined via a successive approximation technique. In operation, a reference signal is multiplied by a series of exponentially related factors to produce a series of intermediate trial signals. The input and intermediate signals are compared and each intermediate signal which is smaller than the input signal becomes the new reference signal. The series of binary comparator output signals for each intermediate signal is the logarithm of that input signal.

14 Claims, 3 Drawing Figures

U.S. Patent     Feb. 27, 1979     4,142,185
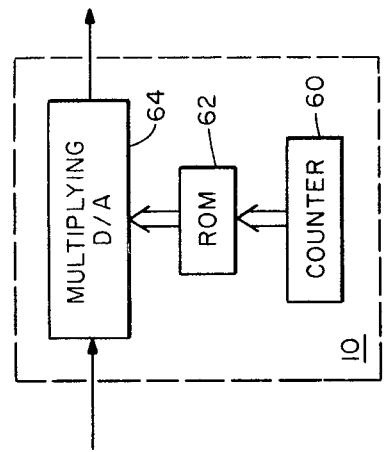
FIG. 3
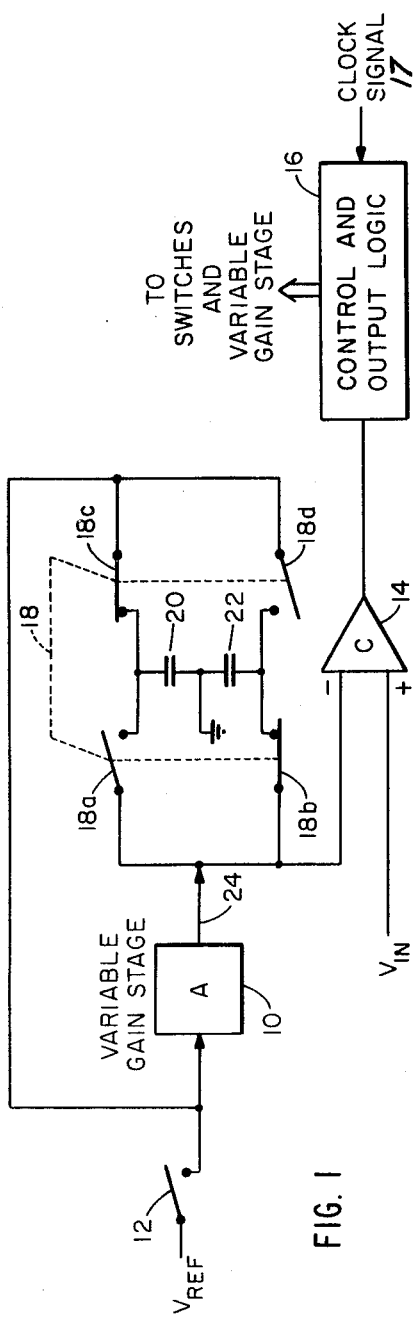
FIG. 1
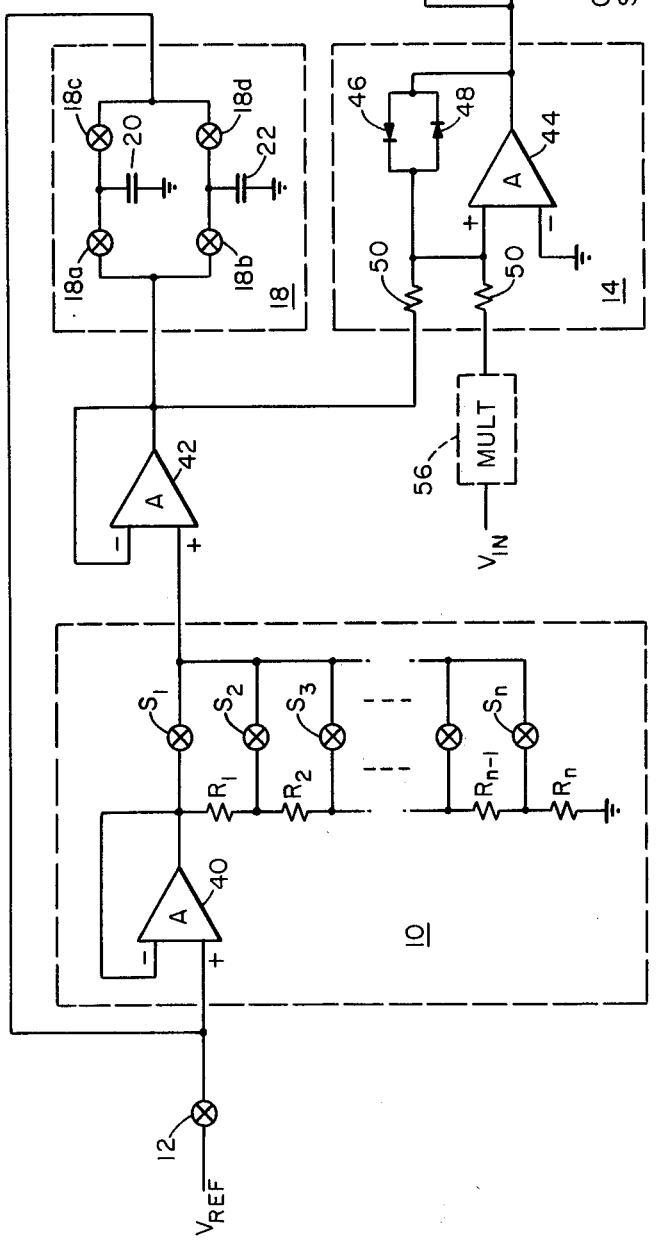

LOGARITHMIC ANALOG-TO-DIGITAL CONVERTER

FIELD OF THE INVENTION

This invention relates to analog-to-digital converters, and more particularly to analog-to-digital converters in which the logarithm of an input signal is computed via a series of successive approximations.

BACKGROUND OF THE INVENTION

Linear analog-to-digital converters presently exist capable of meeting a wide range of operational specifications for use in different applications. Certain applications, however, pose requirements which are better met by logarithmic-types of analog-to-digital converters. Logarithmic converters frequently have advantages over linear converters in applications requiring a very large dynamic range and where the desired accuracy, and hence round-off error, is measured in terms of a specified percentage of the input signal rather than a specified percentage of the maximum output indicated by the converter.

Various techniques for performing logarithmic analog-to-digital conversions have been developed including techniques using the exponential decay with time of a voltage in an RC circuit, circuits in which the linear-to-logarithmic conversion is performed by utilizing the exponential characteristics of a semiconductor junction to perform an analog linear-to-logarithmic conversion which is then converted to digital form, as shown in U.S. Pat. No. 3,444,550, piecewise-linear conversion techniques, and converters using cascaded amplifiers having exponentially related gains which may be switched into and out of a circuit for amplifying a reference voltage, as in U.S. Pat. No. 3,646,548.

SUMMARY OF THE INVENTION

The present invention is very simple with the resulting advantages of low cost and reliability. The converter uses a single amplifying stage whose gain is variable in discrete steps, the different gains being exponentially related, thereby avoiding the precise calibration of many stages of gain required with prior converters. A reference signal is selectively multiplied by the exponentially-related gains of the amplifier to produce a series of intermediate signals which are compared with the input signal. If the intermediate signal does not exceed the input signal, the reference signal is replaced by the present intermediate signal in determining following intermediate signals. In this manner, the input signal is approximated by the intermediate signal composed of a selected product of powers of a predetermined amplification factor and the invention is able to perform these approximations and comparisons very quickly, allowing extremely high-speed conversion. Binary signals resulting from the comparison and corresponding to the selection of factors in the final intermediate signal provide a direct, digital, logarithmic representation of the input signal. As has been mentioned and will become more apparent in reading the detailed description below, the present invention has numerous advantages over previous logarithmic A/D converters.

DESCRIPTION OF THE DRAWINGS

These and other advantages of the invention will become clear upon reading the following detailed description of the invention and with reference to the following figures, in which:

FIG. 1 shows the invention in block diagram form;

FIG. 2 is a more detailed schematic representation of the invention;

FIG. 3 shows an alternate embodiment of the variable gain stage of FIG. 1.

DETAILED DESCRIPTION OF THE INVENTION

It will prove helpful in understanding the operation of the invention to briefly point out at this time the mathematical basis of the operation of the preferred embodiment described below. The application and importance of these principles will become apparent as the operation of the preferred embodiment is described with reference to the example given in Tables 1 and 2 below.

An unknown input voltage may be related to a known reference voltage by an equation of the type, $$V_{IN} = V_{REF} \cdot G^x \qquad (1)$$

where G is a constant gain factor and x is a variable relating $V_{IN}$ to $V_{REF}$. Solving directly for x, the following equation is derived, $$x = C \cdot \log(V_{IN}/V_{REF}) \qquad (2)$$

where C is a constant. Accordingly, x is proportional to the logarithm of the input voltage divided by the reference voltage.

This type of representation is useful in situations where an input voltage has a very large dynamic range with respect to the desired resolution. To take a specific example, an input signal will be assumed which ranges between 1 and 300,000, which is to be converted into a digital signal having an accuracy of 0.2% of the input signal. A linear A/D converter meeting these specifications would require approximately 27 bits. A logarithmic converter would require only 13 bits, as explained below.

A logarithmic converter would follow the equation, $$V_{IN}(1.002)^x = V_{REF} \qquad (3)$$

where x takes on integral values. It can be seen that consecutive integral values of x will correspond with input signals differing by 0.2%, as required. For x ranging from 1 to 8,192, input signals over a 1-to-300,000 range may be represented with an accuracy of 0.2%. Since 1.002 raised to the $8,192^{nd}$ power slightly exceeds 300,000, the integral values of x between 1 and 8,192 may be represented by a 13-bit binary number, in contrast with the 27 bits required by a linear D/A converter.

Returning to equation (1), the term $G^x$ may be expanded as a product of terms as shown below:

$$G^x = \prod_{n=1}^{N} A^{a_n 2^n} \qquad (4)$$

where A is a constant equal to $\sqrt{G}$, $a_n$ equals either 0 to 1, and n is an index variable ranging from 1 to N. Using the values of the previous example, N would equal 13 and any value of $G^x$ between 1 to 300,000 may be represented within 0.2% accuracy by the 13 coefficients $a_n$.

This is shown more clearly when the product of equation (4) is expanded:

$$G^x = A^{a_1 \cdot 2^1} A^{a_2 \cdot 2^2} \ldots A^{a_N \cdot 2^N} \quad (5)$$

From equation (5), it can be seen that $G^x$ may be represented as:

$$G^x = A^{\sum_{n=1}^{N} a_n 2^n} \quad (6)$$

Taking the logarithm of both sides, we find that:

$$x = C \sum_{n=1}^{N} a_n 2^n \quad (7)$$

where C is a constant. Thus, it can be seen that the value x may be represented by a binary number corresponding with the coefficients $a_n$.

While the above derivations and examples have been done for positive integral values of x and n, it should be clear that the derivation holds for negative integral powers of x as well.

Having explained the principles underlying the present invention and some of the advantages flowing therefrom, the construction and operation of the novel converter are now described. Referring to FIG. 1, there is shown a block diagram of the logarithmic A/D converter of the present invention. The following detailed explanation describes how a binary representation is provided by the converter logarithmically relating an unknown input voltage $V_{IN}$ to a known reference voltage $V_{REF}$.

A reference voltage $V_{REF}$ is applied to a variable gain stage 10 through a switch 12. Variable gain stage 10 produces an intermediate signal 24 at its output which is applied to one input of a comparator 14. The input voltage $V_{IN}$ is applied to the other input of comparator 14. The output of comparator 14 is a binary signal indicating when intermediate signal 24 exceeds $V_{IN}$. The output from comparator 14 goes to control and output logic circuit 16 whose function is explained below.

The intermediate signal is also applied via switching network 18 to capacitors 20 and 22. Switching network 18 includes four switches 18a–18d connected to the output of the variable gain stage 10, capacitors 20 and 22, and the input to variable gain stage 10. Switching network 18 operates so that one of the two capacitors 20 and 22 is connected to the output of variable gain stage 10 while the other of the capacitors is connected to the input of variable gain stage 10. Activating switching network 18 causes the connection of the capacitors to be interchanged.

Accordingly, switch 18 is a single-pole switch connecting capacitor 20 with the variable gain stage output. Switch 18b is a single-pole switch connecting capacitor 22 to the variable-gain stage output. Switches 18c and 18d are single-pole switches respectively connecting capacitors 20 and 22 to the input of the variable gain stage 10. Switches 18a–18d are interconnected so that switches 18a and 18d are open when switches 18b and 18c are closed, and vice versa.

The A/D converter shown in FIG. 1 operates in the following manner. A conversion is started by applying an unknown voltage $V_{IN}$ to comparator 14 and properly triggering control logic 16. In response, switch 12 is closed connecting the reference voltage with the input of variable gain stage 10. The conversion is via a successive-approximation technique wherein logic 16 causes the converter to perform a series of cycles in response to clock signal 17, with the gain of variable gain stage 10 being reduced with each successive cycle. Variable gain stage 10 begins a conversion with the gain thereof set at the maximum value during the first cycle. The reference voltage is multiplied by the gain of variable gain stage 10 to produce an intermediate signal 24 at its output which is compared with the input voltage $V_{IN}$ by comparator 14.

If the intermediate signal 24 exceeds the input voltage $V_{IN}$, switching network 18 remains in its present stage. The gain of variable gain stage 10 is reduced to the next lowest value by control and output logic 16 and the next cycle is commenced. If comparator 14 detects that the input voltage $V_{IN}$ exceeds the intermediate signal 24, reference voltage $V_{REF}$ is disconnected from the input of variable gain stage 10 by switch 12 under control of control logic 16. Assuming switching network 18 began in the stage shown in FIG. 1, the intermediate voltage 24 has charged up the capacitor 22, to which the output of variable gain stage 10 was connected, so that intermediate signal 24 is stored on capacitor 22. Simultaneously, with the opening of switch 12, control logic 16 causes switching network 18 to change state so that capacitor 22 is now connected to the input of variable gain stage 10 while capacitor 20 is connected to the output thereof. The result is that during the next cycle the intermediate signal 24 from the previous cycle is now applied to the input of variable gain stage 10. Control logic 16 next selects the next lower gain of variable gain stage 10. During the next cycle, the above process is repeated with the new input voltage to variable gain stage 10 being the previous intermediate voltage 24, stored on capacitor 22.

The above process is repeated during successive cycles as the gain of variable gain stage is lowered step by step through its entire range. The result is that the final value of intermediate signal 24 is an approximation to the input signal $V_{IN}$ consisting of the product of selected terms of an exponentially related series of factors corresponding with equation (6).

The operation of the circuit shown in FIG. 1 can perhaps be seen more clearly by taking a particular example. Using the example cited before with reference to equation (3), an input signal will be assumed which ranges between 1 and 300,000; and this signal is to be converted to a digital signal having an accuracy of 0.2% of the input signal.

As stated above, such a logarithmic converter requires 13 bits. Referring to Table 1, there are shown the different gains which must be realized by variable gain stage 10 in performing the analog-to-digital conversion. The left-most column in Table 1, labeled "n", denotes the number of the bit — bit 13 being the most significant bit. Column 2, labeled "$2^n$", denotes the value of $2^n$, which value is the exponent of the basic value of gain "A" in accordance with equations (4) through (6). The third column labeled "$A^{2^n}$" gives the different gain values for variable gain stage 10.

TABLE 1

| n | $2^n$ | $A^{2^n}$ | 10 | 1000 | 100000 |
|---|-------|-----------|----|------|--------|
| 1 | 2 | 1.0015 | 1 | 1 | 0 |
| 2 | 4 | 1.0031 | 1 | 1 | 1 |
| 3 | 8 | 1.0062 | 1 | 1 | 1 |
| 4 | 16 | 1.0124 | 0 | 0 | 0 |
| 5 | 32 | 1.0250 | 1 | 0 | 1 |
| 6 | 64 | 1.0505 | 0 | 0 | 1 |

TABLE 1-continued

| n | $2^n$ | $A^{2^n}$ | 10 | 1000 | 100000 |
|---|---|---|---|---|---|
| 7 | 128 | 1.1035 | 1 | 0 | 0 |
| 8 | 256 | 1.2178 | 1 | 1 | 0 |
| 9 | 512 | 1.4830 | 1 | 1 | 1 |
| 10 | 1024 | 2.1994 | 0 | 0 | 0 |
| 11 | 2048 | 4.8377 | 1 | 0 | 1 |
| 12 | 4096 | 23.4034 | 0 | 0 | 1 |
| 13 | 8192 | 547.7225 | 0 | 1 | 1 |
| | | $\pi=300{,}000.0$ | $\pi=9.9896$ | $\pi=999.96$ | $\pi=99{,}942.13$ |

It should be noted that the reference voltage $V_{REF}$ and the gain values of variable gain stage 10 are not independent parameters. Doubling the reference voltage is the equivalent of doubling the different values of gain. Therefore, this example will assume a reference voltage of 1 for convenience.

The multiplication of each of the 13 values of gain shown in Table 1 produces a product of 300,000.0. Thus, by selecting the proper factors from the gain shown in Table 1, any value from 1 through 300,000 may be derived. Additionally, since the smallest factor equals 1.0015, the final product will be within the required 0.2% of the desired value. This is demonstrated in the examples given below.

The right-hand portion of Table 1 lists three exemplary input values: 10, 1,000, and 100,000. The 1's and 0's beneath each value correspond with the digital logarithmic value produced by the circuit of FIG. 1. For example, if the input $V_{IN}$ to comparator 14 has a value of 10, the converter shown in FIG. 1 operates in the following manner. During the first cycle, variable gain stage 10 multiplies the unity reference voltage by the largest value of gain, 547.72, as shown in Table 1. Comparator 14 indicates that the output from variable gain stage 10 exceeds the input, and the most significant bit of the output is set to 0 by control and output logic 16. Control and output logic 16 then changes the gain of variable gain stage 10 to the next largest value. Since the last output bit was 0, the same voltage continues to be applied to the input of variable gain stage 10. The same procedure is repeated for the second value of gain, 23.40; and second most significant bit of the digital output is set to 0.

During the third cycle, the gain of variable gain stage 10 is 4.84, and comparator 14 indicates that the output from variable gain stage 10 exceeds the input voltage. In response to this output from comparator 14, control and output logic 16 sets the third-most significant bit in the digital output of 1; and control and output logic 16 also causes switching network 18 to change state and switch 12 to open so that the new output of 4.84 from variable gain stage 10 now is applied to the input of variable gain stage 10.

During the fourth cycle, the input to variable gain stage 10 is 4.84 which is multiplied by the fourth value of gain, 2.20, resulting in an output of 10.64. Comparator 14 indicates that this output exceeds the input voltage and the fourthmost significant bit in the output is set to 0, as shown in Table 1. Since the output is 0, control and output logic 16 causes the same input voltage, 4.84, to continue to be applied to the input of variable gain stage 10. During the fifth cycle, the input to variable gain stage 10 of 4.84 is amplified by the next value of gain, 1.48. This produces an output from variable gain stage 10 of 7.16. Comparator 14 indicates that this output exceeds the input voltage; and control and output logic 16 sets the fifth bit of the output to 1 and causes switching network 18 to change state, thereby applying the new output from variable gain stage 10 of 7.16 to the input of variable gain stage 10 for the next cycle.

This procedure is repeated until all 13 bits of the A/D output have been determined. The resulting digital output is representative of the logarithm of the input voltage. Multiplying the different gain factors indicated by 1's in the output produces a value of 9.9896, which agrees with the input voltage of 10 within 0.11%. The two remaining right-most columns in the table of FIG. 2 shown the logarithmic output produced by the circuit of FIG. 1 for inputs of 1,000 and 100,000, and below these columns is shown the actual value denoted by the digital output. It can be seen that output values are all within the specified 0.2% accuracy.

While Table 1 presents a specific example, it should be clear that other values of A and other ranges for n may be used. In particular, by using an integral power of e for A, the digital output produced is the natural logarithm of the input. Furthermore, it should be apparent that the smaller values of gain for variable gain stage 10 need not be raised to positive powers; negative powers will work equally well.

In FIG. 2, there is shown a particular circuit for implementing the system of FIG. 1. Similarly to the system shown in FIG. 1, the converter shown in FIG. 2 provides a binary output representation of the logarithm of an unknown input voltage in with respect to a known reference voltage. The reference voltage is applied through an electronically controlled switch 12 to the input of variable gain stage 10, shown enclosed within dotted lines. Variable gain stage 10 is implemented in the following manner. The input to variable gain stage 10 is applied to the non-inverting input of an operational amplifier 40. The inverting input of amplifier 40 is connected to its output so the amplifier functions as a unity gain buffer amplifier. Between the output of amplifier 40 and ground is a resistive voltage divider composed of resistors $R_1$ through $R_n$, where n is the number of bits in the output of the A/D converter. The output of amplifier 40 and the nodes between each of the resistors $R_1$ through $R_n$ are connected to a single node, which is the output of variable gain stage 10, by electronically controlled switches $S_1$ through $S_n$. These switches are controlled by control logic 16' to achieve the different gain required of variable gain stage 10. Control logic 16' causes one and only one of each of the switches $S_1$ through $S_n$ to be closed, thereby varying the gain from 1 through some fractional gain less than 1. Referring back to Table 1, it can be seen that in order to achieve the desired overall accuracy of 0.2%, the largest gain must be accurate to within something slightly less than two parts in 547,722. Smaller gains require the same absolute accuracy and correspondingly a much lower proportional accuracy. The precision required of resistors $R_1$ through $R_n$ corresponds with the accuracies required of the different gains of the variable gain stage 10. This precision is much lower than the accuracy required of resistors in a 27-bit linear A/D converter which would be required to realize the same proportional accuracy in the input signal, as described above.

The output from variable gain stage 10 is applied to a second operational amplifier 42 also connected as a unity gain buffer amplifier. The output from amplifier 42 is applied to switching network 18 composed of electronic switches 18a–18d and capacitors 20 and 22 which operate as described above with reference to FIG. 1. The output from amplifier 42 is also applied to comparator 14. Comparator 14 is implemented by means of an operational amplifier 44. The inverting input of amplifier 44 is connected to ground. The output of amplifier 44 is connected via opposed diodes 46 and 48 to the inverting input thereof. The output of buffer amplifier 42 is applied to the input of amplifier 42 via resistor 50; and the input voltage $V_{IN}$ is applied to the input of amplifier 44 via resistor 52.

The output from comparator circuit 14 is applied to control logic 16' and to shift register 16". The output from comparator 14 is clocked to shift register 16" by clock signal 17 at the end of each cycle. When the conversion process has been completed, parallel digital data representative of the logarithm of the input voltage is available at output 54 from shift register 16". Clock signal 17 is also applied to control logic 16'. Control logic 16' operates as described immediately above and with reference to FIG. 1, causing electronic switches 12, 18a–18d, and $S_1$-$S_n$ to open and close as required.

It can be seen that the circuit shown in FIG. 2 requires a minimum number of components and that very few of these components need to meet precision tolerances. Additionally, the circuit shown in FIG. 2 is capable of extremely fast operation. Settling times to within 0.01% may typically be kept to less than ½ microsecond for the unity gain operational amplifiers 40 and 42 and for the electronically controlled switches. Comparator 14 can typically achieve an accuracy of 0.001% within one microsecond. Thus, each bit of the conversion process requires approximately 2 to 3 microseconds and a complete 13-bit conversion, for example, may be performed within 40 microseconds.

The number of bits in the output of the A/D converter shown in FIG. 2 may be increased by increasing the number of different values of gain of variable gain stage 10 and making the necessary changes in the control and output logic. Alternatively, a multiplier 56 may be inserted between the input signal $V_{IN}$ and the input to comparator 14, as shown by dotted lines in FIG. 2. When this is done, the first several most significant bits of the digital output representation are determined by varying the gain of multiplier 56, rather than variable gain stage 10, in logarithmic steps. This method of extending the range of the A/D converter has the advantage of increasing the signal level applied to comparator 14 and thereby increasing the signal-to-noise ratio as the input of comparator 14.

Referring to FIG. 3, there is shown an alternative method of implementing variable gain stage 10. In this method, the output of a counter 60 or other source of digital data is applied to the address inputs of a read-only memory 62. The output of read-only memory 62 is applied to the digital inputs of a multiplying digital-to-analog converter. The input to the variable gain stage 10 shown in FIG. 4 is applied to the analog reference input of multiplying D/A converter 64, and the analog output of D/A converter 64 provides the output of variable gain stage 10. Read-only memory 62 is programmed such that in response to the linear progression of digital inputs from counter 60, the output values from read-only memory 62 are in a logarithmic relationship, causing multiplying D/A converter 64 to provide the required values of gain.

It should be appreciated that various additions and modifications which do not fall outside the scope of the present invention may be made by those of ordinary skill in the art in applying the teachings disclosed herein to different applications. Accordingly, the invention is only to be limited as indicated in the appended claims.

What is claimed is:

1. A method for providing a binary logarithmic representation of the ratio of an input signal and a reference signal, comprising the step of:
   first electronically selecting the reference signal;
   second, performing a series of cycles, each including the following steps:
   multiplying the selected signal by a predetermined factor to produce an intermediate signal;
   comparing the intermediate signal with the input signal to provide a binary output signal representative of which of the two signals is larger;
   storing the value of the intermediate signal and selecting the stored value in place of the previously selected signal only when the output signal provided during the present cycle indicates that the input signal exceeds the intermediate signal;
   reducing the predetermined factor by dividing by $A \cdot B^{(n-x)}$, where A and B are constants, x is the number of cycles to be performed, and n is the number of the current cycle, to provide a new predetermined factor; and then
   returning to the second step to perform a new cycle, unless and until n equals x;
   the binary output signals produced during the series of cycles providing the logarithmic representation.

2. The method of claim 1 wherein the step of storing includes the step of applying the intermediate signal to a capacitor.

3. The method of claim 1 wherein the step of storing further includes the step of alternately connecting first and second capacitors to the intermediate signal so that the intermediate signal is stored thereon, the connection of the capacitors being interchanged only when the output signal indicates that the input signal exceeds the intermediate signal; and
   wherein the step of selecting the stored value to replace the previously selected signal includes selecting the signal previously stored on the capacitor previously connected to the intermediate signal.

4. The method of claim 1 further including the step of clocking the output signal into a shift register during each cycle to provide a parallel binary output signal at the completion of the series of cycles.

5. Apparatus for providing a binary output representation of the logarithm of the ratio of an input signal and a reference signal via a successive-approximation technique in which an intermediate signal is made to approach the input signal during a series of cycles, one bit of the output representation being determined during each cycle, the apparatus comprising:
   multiplier means for multiplying a signal by a discretely variable gain to produce an intermediate signal;
   means for reducing the multiplier gain during each successive cycle by a factor of $A \cdot B^{(x-n)}$, where A and B are constants, x is the number of cycles to be performed, and n is the number of the current cycle;
   means for comparing the intermediate signal produced during each cycle with the input signal to produce an output signal representative of which of the two compared signals is larger; and
   means for accumulating during successive cycles a product signal, equal to the reference signal multiplied by any and each of the multiplying means gains which have produced intermediate signals during previous cycles which are smaller than the input signal, as determined by the comparing means;

means for applying the reference signal to the multiplier input during the first cycle and the product signal thereto during succeeding cycles;

the comparing means output during each successive cycle providing the binary output representation.

6. The apparatus of claim 5 wherein the multiplying means includes a multiplying digital-to-analog converter, the analog input thereof being the multiplying means input and the digital inputs thereof being controlled by the reducing means to provide a variable gain.

7. The apparatus of claim 5 wherein the multiplying means includes a variable-gain amplifier.

8. The apparatus of claim 7 wherein the accumulating means further comprises:

first and second capacitors, one terminal of each capacitor being grounded;

means for connecting one of the capacitors to the input of the variable gain amplifier and the other capacitor to the output of the variable gain amplifier, so that a signal previously stored on the first capacitor is amplified to provide the intermediate signal currently stored on the second capacitor;

means for reversing the respective connection of the capacitors during the cycle following each occurrence of a comparator output signal indicating that the input signal exceeds the intermediate signal.

9. The apparatus of claim 8 wherein the variable gain amplifier includes:

an amplifying stage;

a plurality of resistors equal in number to x connected in series between the amplifier stage output and ground;

a plurality of electronically activated normally-open switches, equal in number to x, the first terminal of one switch being connected to the amplifying stage output, the first terminals of the remaining switches being respectively connected to each of the series connections between resistors, the second terminals of the plurality of switches being connected in common and forming the variable gain amplifier output;

means for controlling the switches so that during each cycle only one switch is closed;

the amplifying stage gain and the resistor values being chosen to produce the required values of selected gain.

10. The apparatus of claim 5 wherein the means for accumulating includes:

means for storing the intermediate signal; and control means, operative only in response to comparing means output signals indicating that the input signal exceeds the intermediate signal, for replacing the signal applied to the input of the multiplying means by the stored intermediate signal;

the means for applying being operative to apply the reference signal to the multiplying means input until first operation of the control means to replace the reference signal.

11. The apparatus of claim 10 wherein the storing means stores the intermediate signal as a charge on a capacitor.

12. The apparatus of claim 5 further comprising a shift register into which the comparator output signal is clocked during each cycle to provide a parallel binary value corresponding to the binary output representation.

13. The apparatus of claim 5 wherein A and B are positive or negative integral powers of e so that by properly locating a decimal point, the binary output representation is the natural logarithm of the ratio of the input and reference signals.

14. A successive-approximation, logarithmic analog-to-digital converter for producing a binary output signal, one bit during each of a series of cycles, representative of the logarithm of the ratio of an input signal and a reference signal, comprising:

a reference signal source;

means for producing clock signals designating transition times between cycles;

a variable-gain stage having n discrete values of gain, where n is the number of bits in the converter output signal, the gain values being equal to $A \cdot B^x$, where A and B are constants, for x having integral values;

the output from the variable gain stage being an intermediate signal;

means for comparing the intermediate signal with the input signal to produce a comparator output signal representative of which of the two compared signals is larger;

means for storing the intermediate signal; and means, operative in response to a comparator output signal indicating that the input signal exceeds the intermediate signal, for replacing the signal applied to the variable gain stage input with the stored intermediate signal, the conversion being begun by applying the reference signal to the input of the variable gain stage;

the comparator output signal for each cycle being the converter output representation.

* * * * *